(12) United States Patent  
Chen

(10) Patent No.: US 11,115,034 B2  
(45) Date of Patent: Sep. 7, 2021

(54) SIGNAL DETECTION CIRCUIT AND SIGNAL DETECTION METHOD

(71) Applicant: Realtek Semiconductor Corp., HsinChu (TW)

(72) Inventor: Bing-Hung Chen, Hsinchu County (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 16/993,275

(22) Filed: Aug. 14, 2020

(65) Prior Publication Data

US 2021/0099179 A1 Apr. 1, 2021

(30) Foreign Application Priority Data

Sep. 26, 2019 (TW) .................................. 108134857

(51) Int. Cl.
*H04L 7/00* (2006.01)
*H03L 7/091* (2006.01)
*H03K 3/356* (2006.01)
*H03L 7/183* (2006.01)
*H03L 7/08* (2006.01)

(52) U.S. Cl.
CPC ............. *H03L 7/091* (2013.01); *H03K 3/356* (2013.01); *H03L 7/0807* (2013.01); *H03L 7/183* (2013.01)

(58) Field of Classification Search
CPC ....... H03L 7/091; H03L 7/183; H03L 7/0807; H03L 7/0995; H03K 3/356
USPC ................ 375/355, 373, 375, 376, 316, 327
See application file for complete search history.

(56) References Cited

U.S. PATENT DOCUMENTS

2004/0155687 A1\* 8/2004 Lee ...................... H03L 7/0995
327/165

FOREIGN PATENT DOCUMENTS

TW I249301 2/2006
TW I434168 B 4/2014

\* cited by examiner

*Primary Examiner* — Phuong Phu
(74) *Attorney, Agent, or Firm* — Winston Hsu

(57) ABSTRACT

The present invention provides a signal detection circuit, wherein the signal detection circuit includes a sampling circuit and a determination circuit. In the operations of the signal detection circuit, the sampling circuit uses a plurality of clock signals to sample an input signal to generate a sampling result, wherein the plurality of clock signals have different phases, and frequencies of the plurality of clock signals are lower than a frequency of the input signal. The determination circuit refers to the sampling result to determine if the input signal comprises valid data, so as to determine if the input signal comes from outside a chip, wherein the chip includes the signal detection circuit.

15 Claims, 7 Drawing Sheets

SIGNAL DETECTION CIRCUIT AND SIGNAL DETECTION METHOD

BACKGROUND OF THE INVENTION

1. Field of the Invention

The present invention relates to a signal detection circuit.

2. Description of the Prior Art

In a chip related to a communication system, a signal detection circuit is usually provided to determine whether a signal from another device has been received for subsequent operations or for waking up an internal sleeping component. The above signal detection circuit can generally be implemented by a rectifier, a switching circuit sampling technology or a high-gain latch circuit sampling technology. When using the rectifier, however, because the rectifier attenuates the input signal, it will cause poor accuracy when the amplitude of the input signal is small. When switching circuit sampling technology is used, the amplitude of the input signal must be greater than the turn-on voltage of the transistor for normal operation, and if the amplitude of the input signal is too small, the accuracy will be affected by noise. When the high-gain latch circuit sampling technology is used, because the input signal and a cock signal are not synchronized, an over-sampling method is required to ensure that the input signal is not sampled at the transition time. In addition, using the over-sampling method means that multiple latch circuits are needed, thus increasing the load of the input signal, affecting the signal quality, and also increasing the manufacturing cost.

SUMMARY OF THE INVENTION

It is therefore an objective of the present invention to provide a signal detection circuit, which uses a plurality of clock signals having lower frequency to sample a high-speed input signal, and phases of the plurality of clock signals are designed to avoid continuous sampling the transition time of input signal, to solve the above-mentioned problems.

In one embodiment of the present invention, a signal detection circuit is disclosed, wherein the signal detection circuit comprises a sampling circuit and a determination circuit. In the operations of the signal detection circuit, the sampling circuit uses a plurality of clock signals to sample an input signal to generate a sampling result, wherein the plurality of clock signals have different phases, and frequencies of the plurality of clock signals are lower than a frequency of the input signal. The determination circuit refers to the sampling result to determine if the input signal comprises valid data, so as to determine if the input signal comes from outside a chip, wherein the chip comprises the signal detection circuit.

In another embodiment of the present invention, a signal detection method is disclosed. The signal detection method comprises the steps of: using a plurality of clock signals to sample an input signal to generate a sampling result, wherein the plurality of clock signals have different phases, and frequencies of the plurality of clock signals are lower than a frequency of the input signal; referring to the sampling result to determine if the input signal comprises valid data, so as to determine if the input signal comes from outside a chip.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
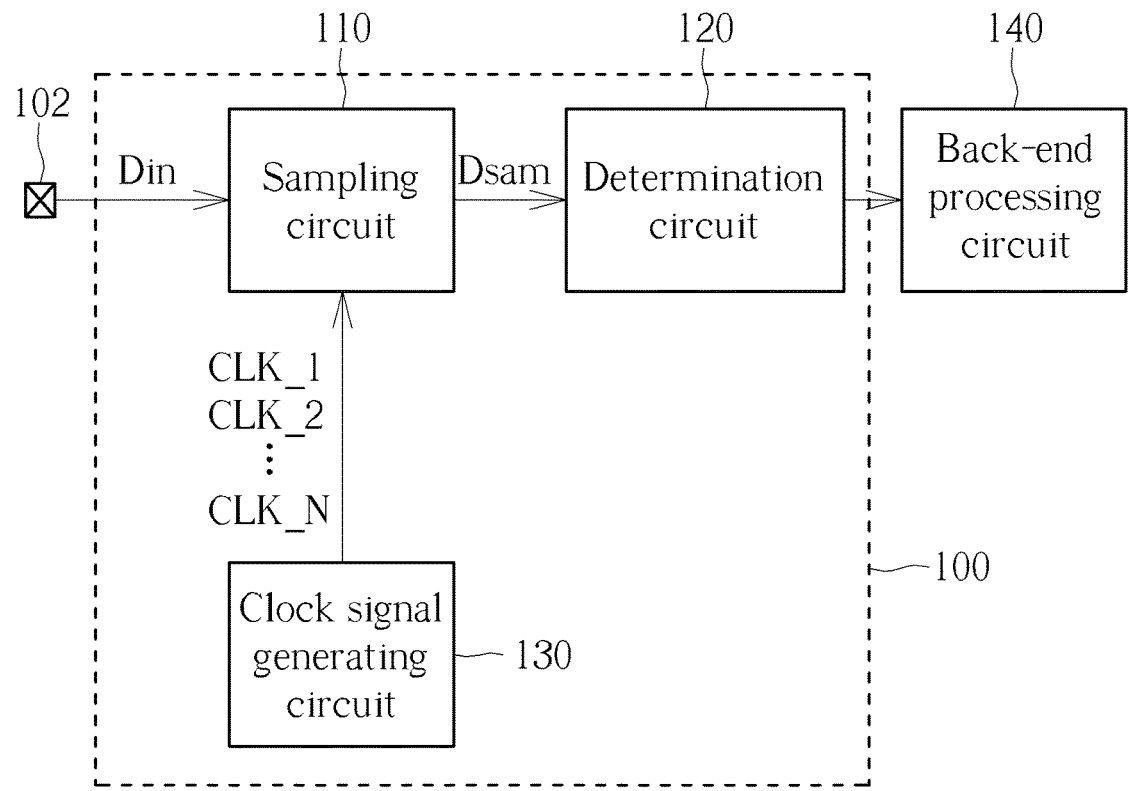
FIG. 1 is a diagram illustrating a signal detection circuit according to one embodiment of the present invention.

FIG. 1 is a diagram illustrating a signal detection circuit 100 according to one embodiment of the present invention. As shown in FIG. 1, the signal detection circuit 100 comprises a sampling circuit 110, a determination circuit 120 and a clock signal generating circuit 130. In this embodiment, the signal detection circuit 100 positioned in a front-end circuit of a chip, and the signal detection circuit 100 is configured to detect if receiving an input signal Din from another device via a node 102, for a back-end processing circuit 140 to perform related operations. For example, the signal detection circuit 100 can detect whether there is a signal on the node 102 (that is, whether it has valid data or whether it has amplitude) in a real-time manner, to notify a physical layer circuit and a media access control circuit in the back-end processing circuit 140, or to wake up the sleeping components in the back-end processing circuit 140.

In the operations of the signal detection circuit 100, the clock signal generating circuit 130 generates a plurality of clock signal signals CLK_1-CLK_N having different phases, wherein N can be any suitable positive integer, every two of the clock signal signals CLK_1-CLK_N have different phases, and the frequency of each of the clock signal signals CLK_1-CLK_N is lower than an input signal Din coming from another device. In addition, the clock signal generating circuit 130 sequentially and periodically sends the clock signals CLK_1-CLK_N to the sampling circuit 110, for the sampling circuit 110 to use one of the clock signals CLK_1-CLK_N to sample the input signal Din to generate a sampling result Dsam. Then, the determination circuit 120 refers to the sampling result Dsam to determine if the input signal Din comprises valid data, so as to determine if the input signal Din comes from outside the node 102, to notify the back-end processing circuit 140 to perform the related operations. For example, if the sampling result Dsam indicates that the input signal Din always has a low voltage level corresponding to a logic value "0", it means that the input signal Din does not have amplitude or valid data. In addition, if the sampling result Dsam indicates that the input signal Din sometimes has high voltage level corresponding to the logic value "1", it means that the input signal Din comes from outside the node 102.

Figure 2:
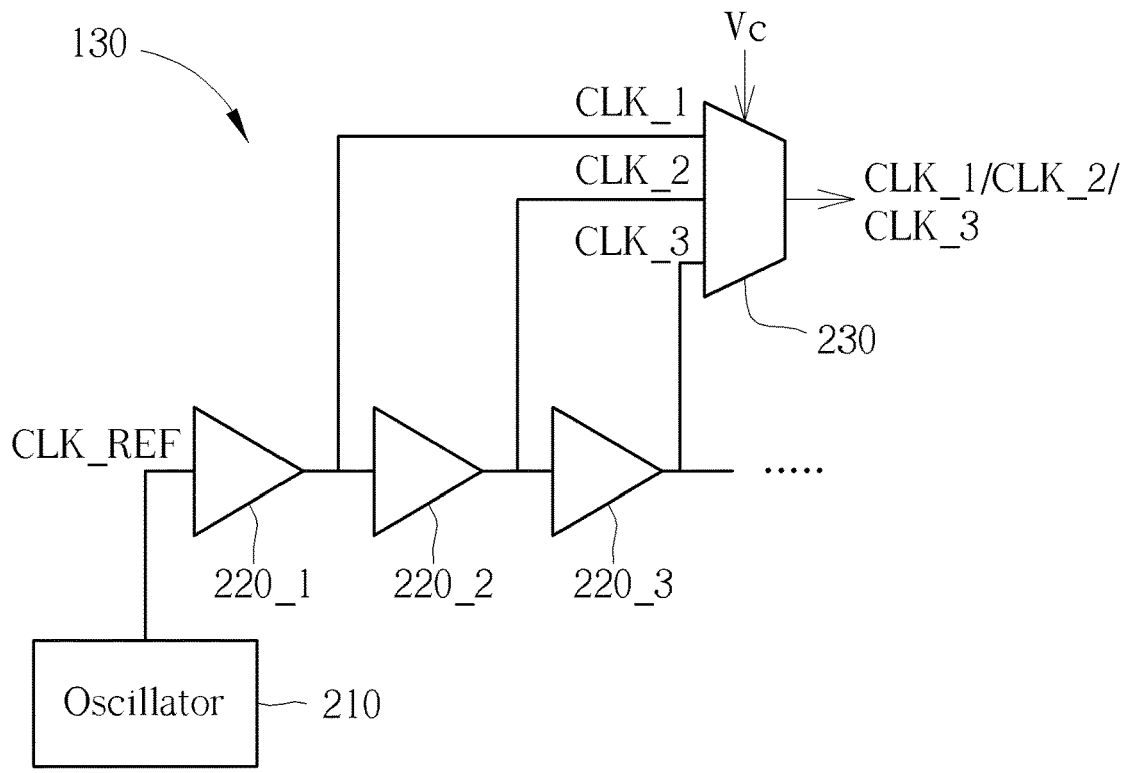
FIG. 2 is a diagram illustrating a clock signal generating circuit according to one embodiment of the present invention.
Figure 3:
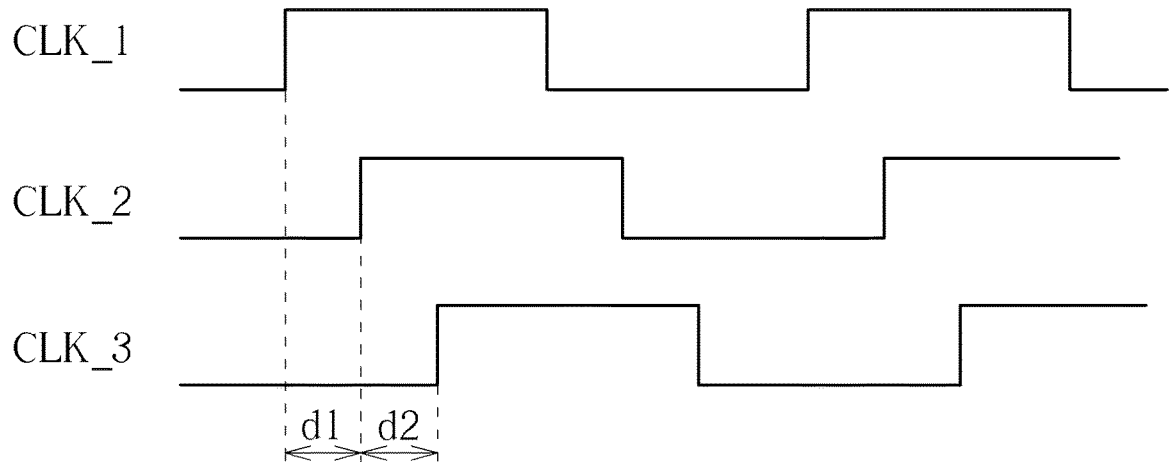
FIG. 3 shows a plurality of clock signals.

FIG. 2 is a diagram illustrating the clock signal generating circuit 130 according to one embodiment of the present invention. As shown in FIG. 2, the clock signal generating circuit 130 comprises an oscillator 210, a plurality of buffers serving as delay circuits (in this embodiment, there are three buffers 220_1-220_3) and a multiplexer 230. In the operations of the clock signal generating circuit 130, the oscillator 210 is configured to generate a reference clock signal CLK_REF to the buffer 220_1, and output signals of the buffers 220_1-220_3 are served as the clock signals CLK_1-CLK_3. The multiplexer 230 refers to a control signal Vc to sequentially output the clock signals CLK_1-CLK_3. FIG. 3 shows the clock signals CLK_1-CLK_3, wherein a phase difference between the clock signals CLK_1 and CLK_2 is "d1" (i.e. the delay amount provided by the buffer 220_2), a phase difference between the clock signals CLK_2 and CLK_3 is "d2" (i.e. the delay amount provided by the buffer 220_3), and the clock signals CLK_1-CLK_3 have the same frequency. It is noted that the circuit architecture shown in FIG. 2 is only an example and is not a limitation of the present invention, that is, as long as the clock signal generating circuit 130 can sequentially output multiple clock signals with different phases, the clock signal generating circuit 130 can have different circuit designs.

Figure 4:
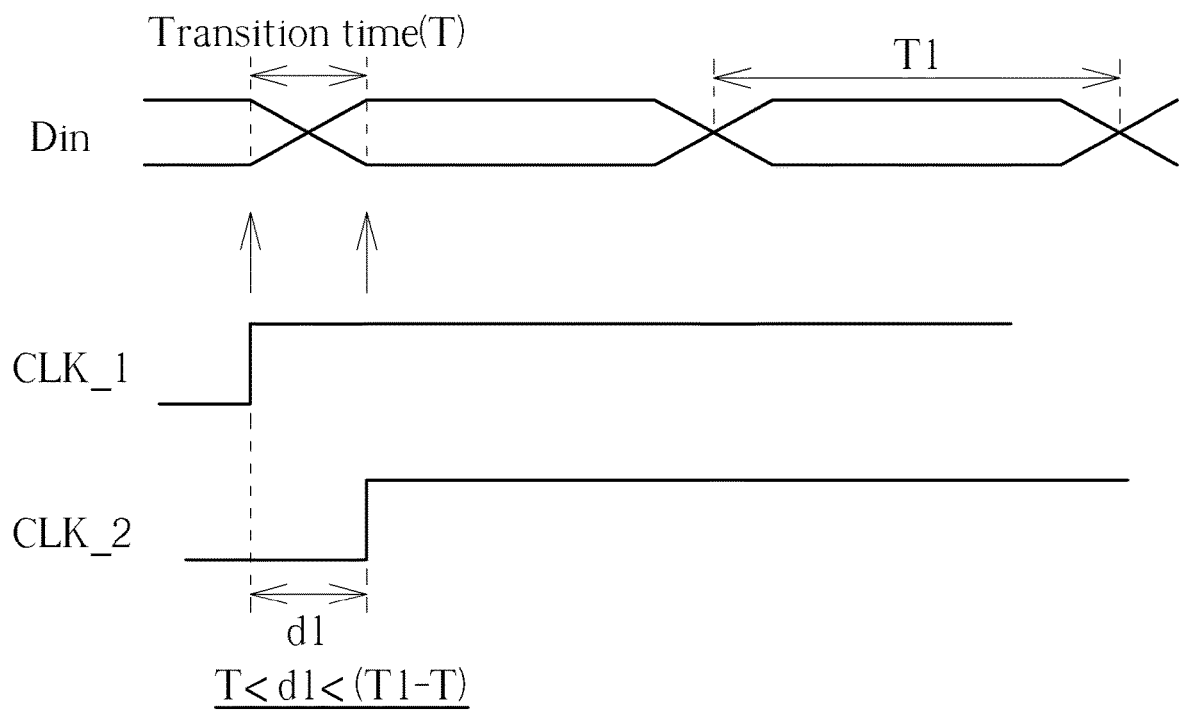
FIG. 4 is a diagram illustrating that the plurality of clock signals are used to sample an input signal according to one embodiment of the present invention.

Referring to the embodiment shown in FIG. 4, it is assumed that the period of the input signal Din is "T1", the transition time of the input signal Din is "T" (which can be a predetermined value), and the clock signals CLK_1-CLK_3 generated by the clock signal generating circuit 130 have the period "T2", and the period of the clock signal CLK_1-CLK_3 is an integer multiple of the period of the input signal Din (that is, T2=n*T1, n is a positive integer). In this embodiment, as long as the delay amount provided by the buffer 220_2 is designed so that the phase difference "d1" between the clock signals CLK_1 and CLK_2 is ranging from "T" to (T1−T), it can be ensured that the non-transition time region of the input signal Din can be sampled within two sampling cycles (i.e., at least one of the sampled results generated by using the clock signals CLK_1 and CLK2 corresponds to the non-transition time region of the input signal Din), to quickly and effectively detect the input signal Din.

Figure 5:
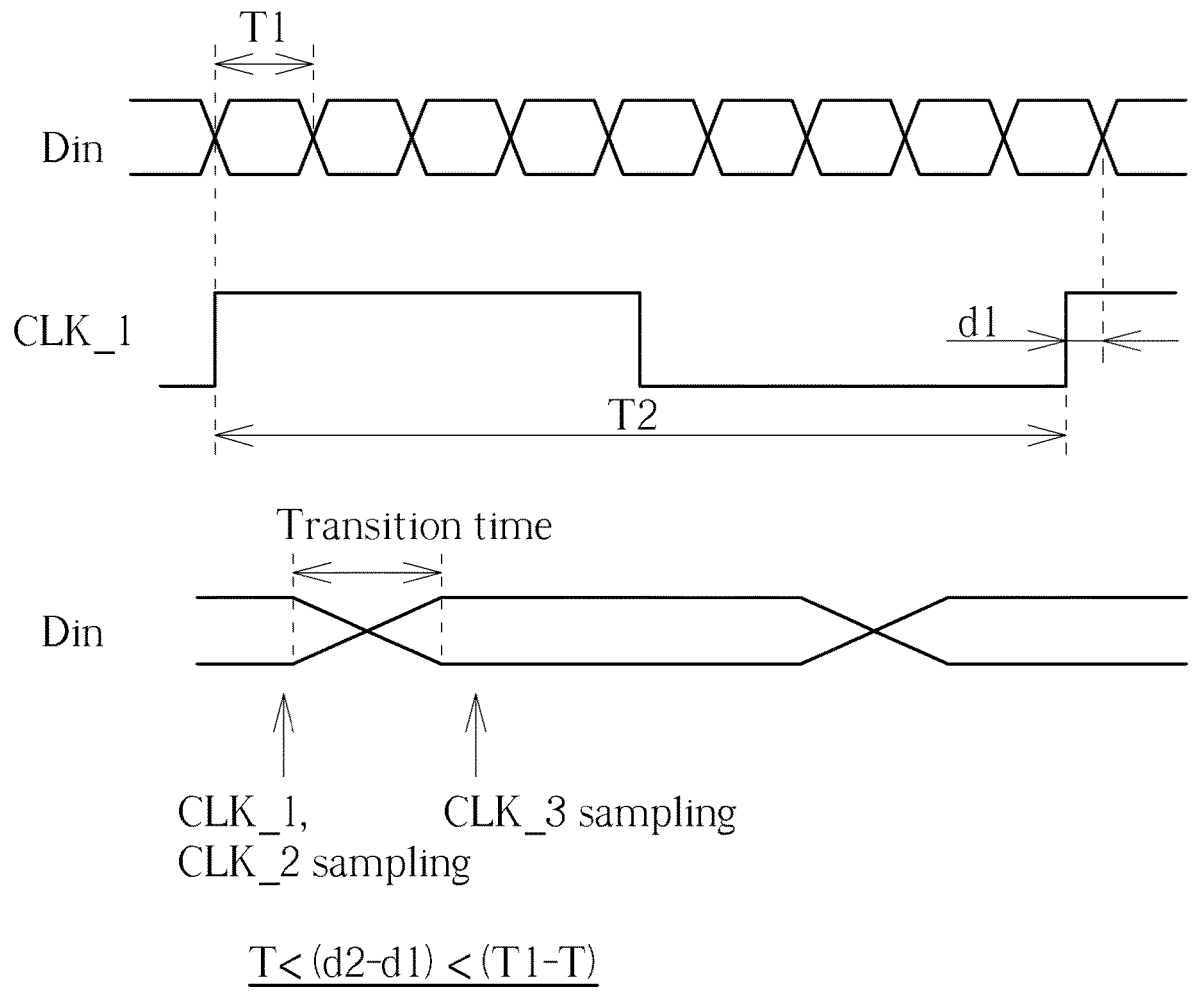
FIG. 5 is a diagram illustrating that the plurality of clock signals are used to sample the input signal according to another embodiment of the present invention.

In addition, referring to the embodiment shown in FIG. 5, it is assumed that the period of the clock signals CLK_1-CLK_3 is an integer multiple of the period of the input signal Din minus a delay amount, and the delay amount is exactly equal to the delay amount provided by the buffer 220_2 (that is, T2+d1=n*T1, n is a positive integer). In this embodiment, as long as the delay amount provided by the buffer 220_3 is designed so that the difference "d2−d1" is between "T" and (T1−T), it can ensure that the non-transition time region can be sampled within three sampling cycles (i.e., at least one of the sampled results generated by using the clock signals CLK_1, CLK2 and CLK_3 corresponds to the non-transition time region of the input signal Din), to quickly and effectively detect the input signal Din.

By using the signal detection circuit 100 described in the above embodiment, the clock signals CLK_1-CLK_3 with different phases are used to sample the input signal Din, which can effectively avoid continuous sampling the transition time of input signal Din, especially when the phases of the clock signals CLK_1-CLK_3 do not synchronize the phase of the input signal Din. In addition, because the frequency of the clock signals CLK_1-CLK_3 is lower than the input signal Din, the design of the sampling circuit 110 is also relatively simple to reduce the design and manufacturing cost of the signal detection circuit 100.

Figure 6:
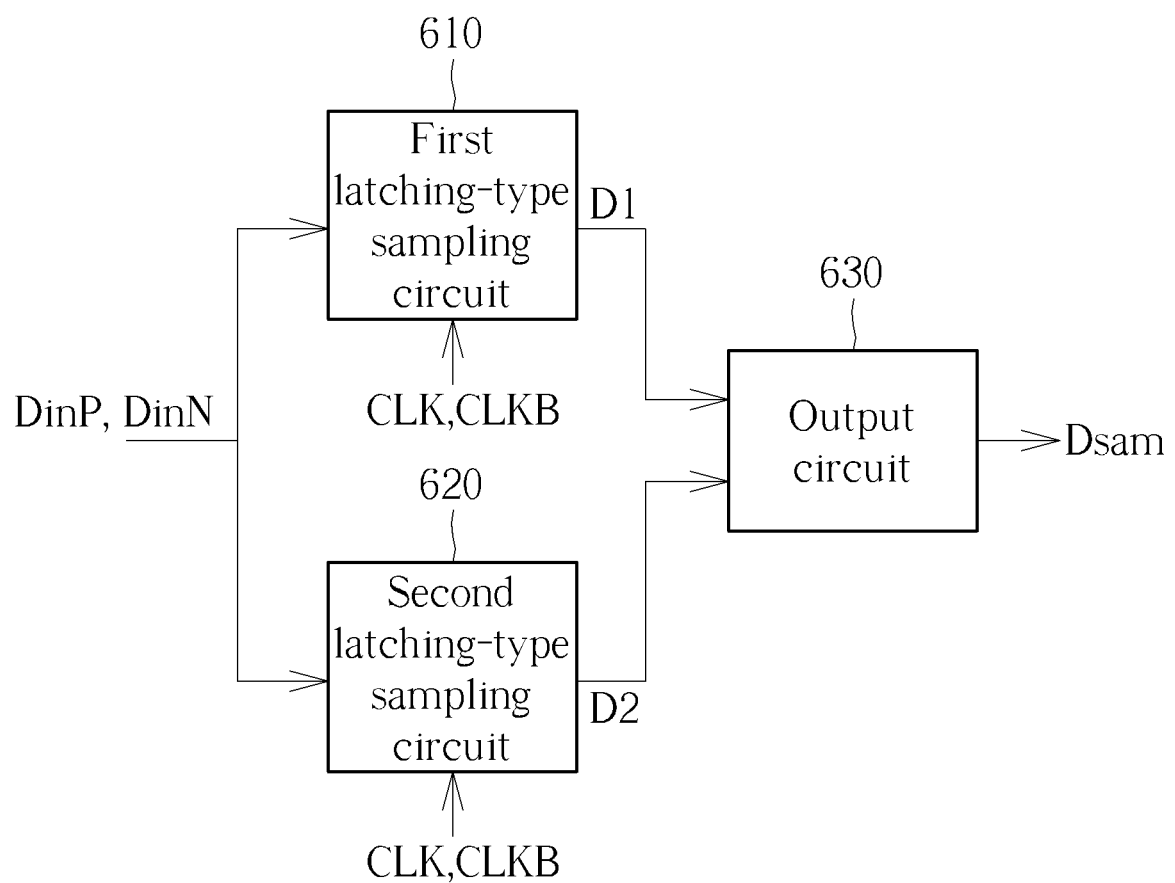
FIG. 6 is a diagram illustrating a sampling circuit according to one embodiment of the present invention.

FIG. 6 is a diagram illustrating the sampling circuit 110 according to one embodiment of the present invention. As shown in FIG. 6, the input signal comprises a first input signal DinP and a second input signal DinN served as a differential signal, and the sampling circuit 110 comprises a first latching-type sampling circuit 610, a second latching-type sampling circuit 620 and an output circuit 630. In the operations of the sampling circuit 110, the first latching-type sampling circuit 610 receives the first input signal DinP and the second input signal DinN, and uses the clock signals CLK and CLK_B to sample the first input signal DinP to generate a first sampled signal D1; and the second latching-type sampling circuit 620 receives the first input signal DinP and the second input signal DinN, and uses the clock signals CLK and CLK_B to sample the second input signal DinN to generate a second sampled signal D2, wherein the clock signal CLK is an output signal of the multiplexer 230, that is the clock signal CLK is sequentially the clock signal CLK_1, CLK_2, CLK_3, . . . , and the clock signal CLKB is the inverted signal of the clock signal CLK. Then, the output circuit 630 may perform a logical operation (e.g. an OR gate operation) on the first sampled signal D1 and the second sampled signal D2 to generate a sampling result Dsam.

Figure 7:
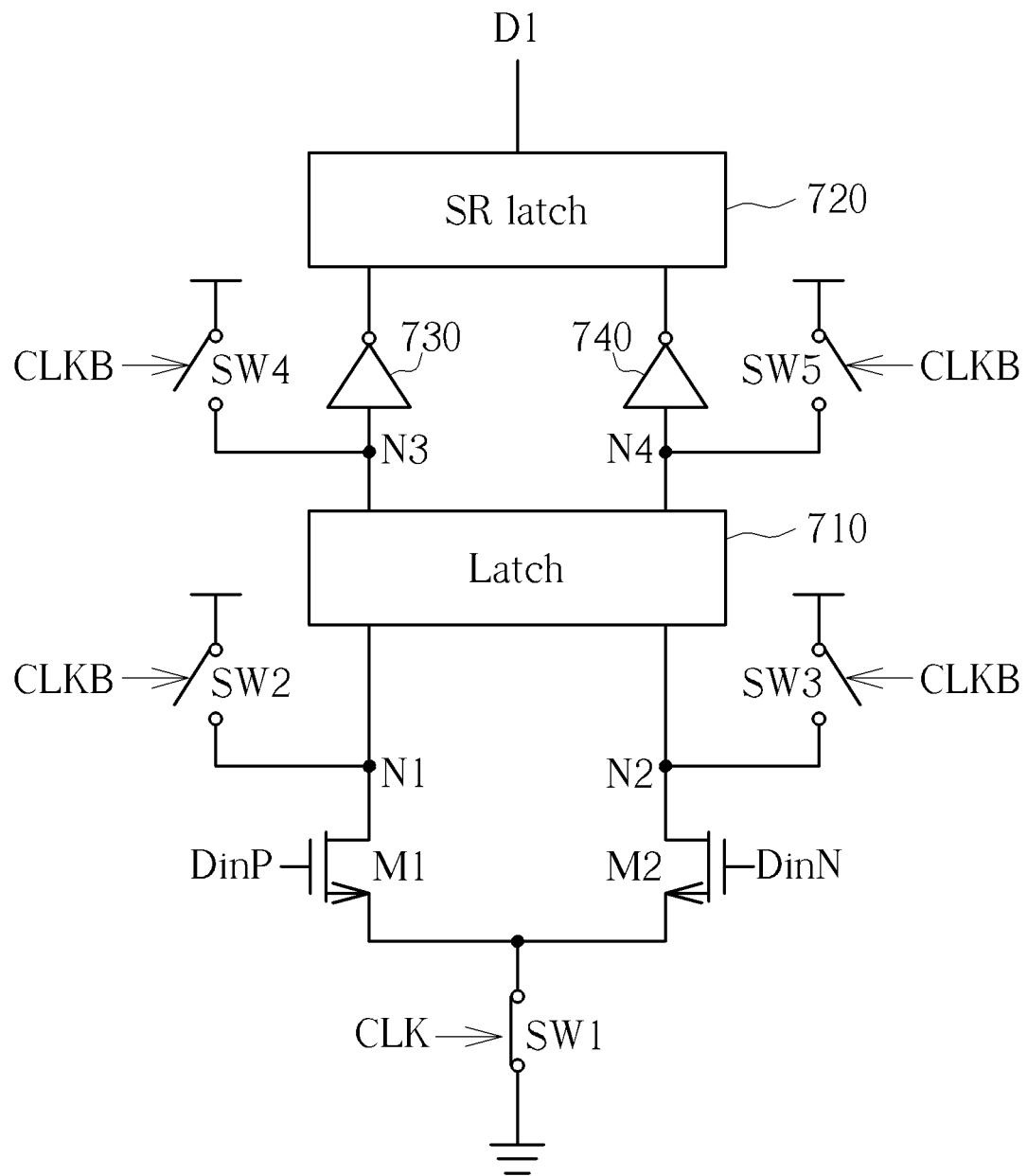
FIG. 7 is a diagram illustrating a latching-type sampling circuit according to one embodiment of the present invention.
Figure 8:
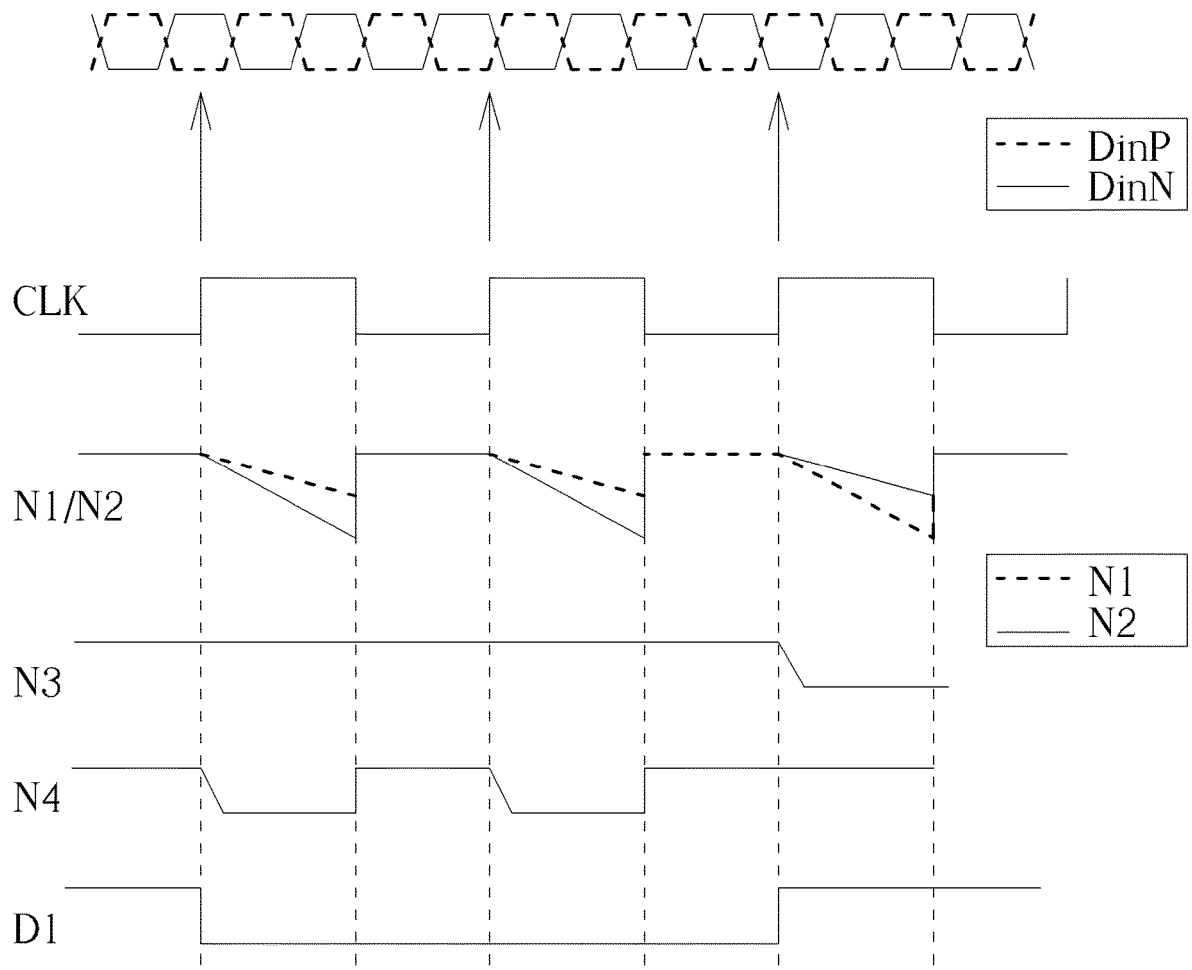
FIG. 8 shows voltages of a plurality of nodes and signals shown in FIG. 7.

In this embodiment, the first latching-type sampling circuit 610 and the second latching-type sampling circuit 620 may be any circuit including a latch for sampling. For example, FIG. 7 is a diagram illustrating the first latching-type sampling circuit 610 according to one embodiment of the present invention. As shown in FIG. 7, the first latching-type sampling circuit 610 comprises a latch 710, a set-reset (SR) latch 720, two inverters 730 and 740, two transistors M1 and M2, and a plurality of switches SW1-SW5, wherein the switches SW1-SW5 are controlled by the clock signals CLK and CLKB, respectively. FIG. 8 shows voltage levels of the first input signal DinP, the second input signal DinN, the clock signal CLK, the nodes N1-N4 and the first sampled signal D1 shown in FIG. 7. In addition, the second latching-type sampling circuit 620 can also be implemented by using the embodiment similar to that shown in FIG. 7. Because a person skilled in the art should be able to implement the second latching-type sampling circuit 620 according to the embodiment shown in FIG. 7 for sampling the second input signal DinN, the details about the second latching-type sampling circuit 620 are omitted here. As described above, the present invention can indeed use the lower frequency clock signal CLK to effectively complete the signal detection in the case of using the sampling circuit 110 with a simple structure.

Figure 9:
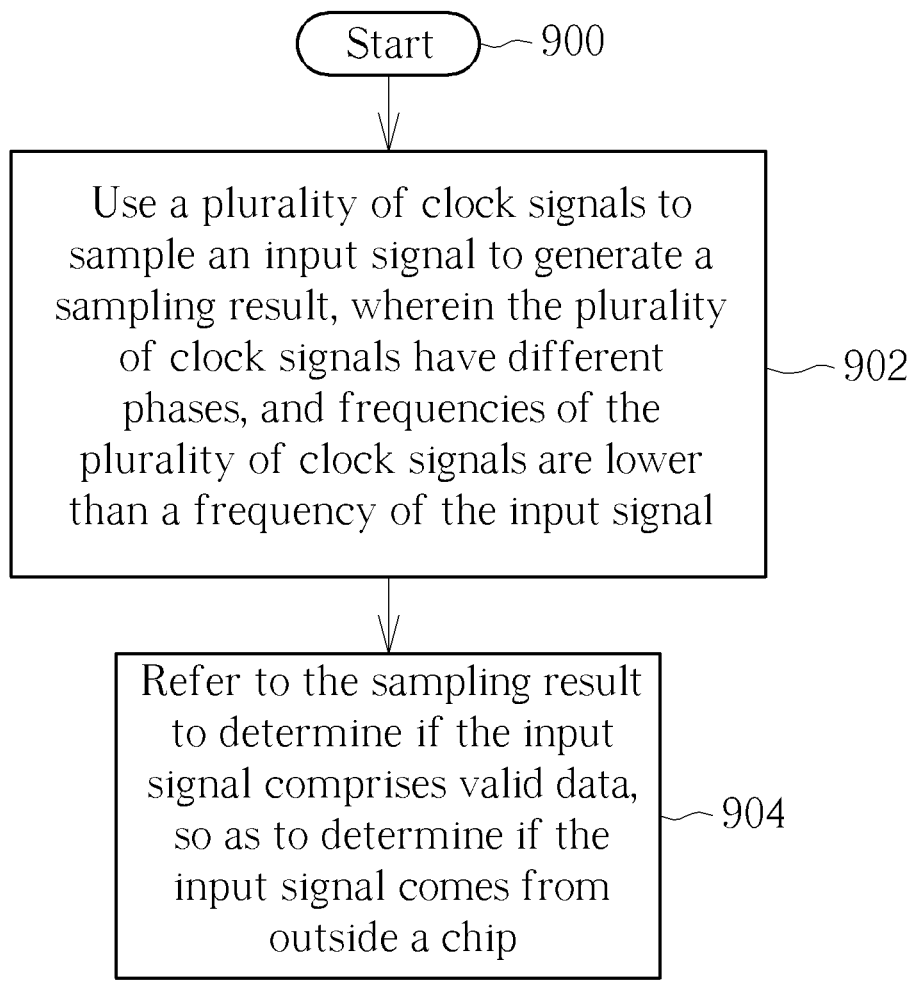
FIG. 9 is a flowchart of a signal detection method according to one embodiment of the present invention.

FIG. 9 is a flowchart of a signal detection method according to one embodiment of the present invention. Refer to the embodiments of FIGS. 1-8 together, the flow of the signal detection method is described as follows.

Step 900: the flow starts.

Step 902: use a plurality of clock signals to sample an input signal to generate a sampling result, wherein the plurality of clock signals have different phases, and frequencies of the plurality of clock signals are lower than a frequency of the input signal.

Step 904: refer to the sampling result to determine if the input signal comprises valid data, so as to determine if the input signal comes from outside a chip.

Briefly summarized, in the signal detection circuit of the present invention, clock signals with lower frequency are used to sample a high-frequency input signal by using a latching-type sampling circuit, so the number of latches can be reduced, and the load effect of the high-speed input signal can also be reduced to improve signal quality and effectively reduce chip area. In addition, by using the special phase design of the clock signals, when the input signal is not synchronized with the clock signal, the non-transition time of the input signal can be sampled at least once within three sampling cycles, for fast and effective detecting the input signal.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal detection circuit, comprising:
    a sampling circuit, configured to use a plurality of clock signals to sample an input signal to generate a sampling result, wherein the plurality of clock signals have different phases, and frequencies of the plurality of clock signals are lower than a frequency of the input signal; and
    a determination circuit, coupled to the sampling circuit, configured to refer to the sampling result to determine if the input signal comprises valid data, so as to determine if the input signal comes from outside a chip, wherein the chip comprises the signal detection circuit;
    a clock signal generating circuit, configured to generate the plurality of clock signals having different phases according to a reference clock signal, wherein the clock signal generating circuit sequentially outputs the plurality of clock signals having different phases to the sampling circuit, for the sampling circuit to use only one of the plurality of clock signals to sample the input signal at a time.

2. The signal detection circuit of claim 1, wherein the plurality of clock signals comprise a first clock signal and a second clock signal, a phase difference between the first clock signal and the second clock signal is greater than a transition time of the input signal, and the phase difference between the first clock signal and the second clock signal is less than a difference between a period of the input signal and the transition time.

3. The signal detection circuit of claim 2, wherein the plurality of clock signals further comprise a third clock signal, a difference between a first phase different and a second phase difference is greater than the transition time of the input signal, and the difference between the first phase different and the second phase difference is less than the difference between the period of the input signal and the transition time, wherein the first phase difference is the phase difference between the first clock signal and the second clock signal, and the second phase difference is a phase difference between the second clock signal and the third clock signal.

4. The signal detection circuit of claim 1, wherein the sampling circuit comprises latches to use the plurality of clock signals to sample the input signal to generate the sampling result.

5. The signal detection circuit of claim 4, wherein the sampling circuit comprises:
    a first latching-type sampling circuit, configured to use the plurality of clock signals to sample the input signal to generate the sampling result.

6. The signal detection circuit of claim 5, wherein the input signal is a differential signal comprising a first input signal and a second input signal, the first latching-type sampling circuit is configured to use the plurality of clock signals to sample the first input signal to generate a first sampled signal; and the sampling circuit further comprises:
    a second latching-type sampling circuit, configured to use the plurality of clock signals to sample the second input signal to generate a second sampled result; and
    an output circuit, coupled to the first latching-type sampling circuit and the second latching-type sampling circuit, configured to generate the sampling result according to the first sampled result and the second sampled result.

7. A signal detection method, comprising:
    using a sampling circuit to use a plurality of clock signals to sample an input signal to generate a sampling result, wherein the plurality of clock signals have different phases, and frequencies of the plurality of clock signals are lower than a frequency of the input signal; and
    referring to the sampling result to determine if the input signal comprises valid data, so as to determine if the input signal comes from outside a chip;
    using a clock signal generating circuit to generate the plurality of clock signals having different phases according to a reference clock signal, wherein the clock signal generating circuit sequentially outputs the plurality of clock signals having different phases to the sampling circuit, for the sampling circuit to use only one of the plurality of clock signals to sample the input signal at a time.

8. The signal detection method of claim 7, wherein the plurality of clock signals comprise a first clock signal and a second clock signal, a phase difference between the first clock signal and the second clock signal is greater than a transition time of the input signal, and the phase difference between the first clock signal and the second clock signal is less than a difference between a period of the input signal and the transition time.

9. The signal detection method of claim 8, wherein the plurality of clock signals further comprise a third clock signal, a difference between a first phase different and a second phase difference is greater than the transition time of the input signal, and the difference between the first phase different and the second phase difference is less than the difference between the period of the input signal and the transition time, wherein the first phase difference is the phase difference between the first clock signal and the second clock signal, and the second phase difference is a phase difference between the second clock signal and the third clock signal.

10. The signal detection method of claim 7, wherein the step of using the plurality of clock signals to sample the input signal to generate the sampling result is performed by a sampling circuit comprising latches.

11. The signal detection method of claim 10, wherein the input signal is a differential signal comprising a first input signal and a second input signal, and the step of using the plurality of clock signals to sample the input signal to generate the sampling result comprises:
    using the plurality of clock signals to sample the first input signal to generate a first sampled result;
    using the plurality of clock signals to sample the second input signal to generate a second sampled result; and generating the sampling result according to the first sampled result and the second sampled result.

12. The signal detection circuit of claim 1, wherein the clock signal generating circuit comprises:
   an oscillator, configured to generate the reference clock signal;
   a plurality of delay circuits, configured to generate the plurality of clock signals having different phases; and
   a multiplexer, coupled to the plurality of delay circuits, configured to receive the plurality of clock signals and sequentially output the plurality of clock signals to the sampling circuit.

13. The signal detection circuit of claim 12, wherein the plurality of delay circuits are connected in series, and output signals of a portion of the delay circuits serve as the plurality of clock signals.

14. The signal detection method of claim 7, wherein the clock signal generating circuit comprises:
   an oscillator, configured to generate the reference clock signal;
   a plurality of delay circuits, configured to generate the plurality of clock signals having different phases; and
   a multiplexer, coupled to the plurality of delay circuits, configured to receive the plurality of clock signals and sequentially output the plurality of clock signals to the sampling circuit.

15. The signal detection method of claim 14, wherein the plurality of delay circuits are connected in series, and output signals of a portion of the delay circuits serve as the plurality of clock signals.

\* \* \* \* \*